United States Patent [19]
Davis et al.

[11] Patent Number: 5,170,554
[45] Date of Patent: Dec. 15, 1992

[54] HIGH MIX PRINTED CIRCUIT ASSEMBLY TECHNIQUE

[75] Inventors: Thomas C. Davis, Mountain View; Eva M. Selep, Folsom, both of Calif.

[73] Assignee: Hewlett-Packard Company, Palo Alto, Calif.

[21] Appl. No.: 589,748

[22] Filed: Sep. 28, 1990

[51] Int. Cl.⁵ .............................................. H05K 3/30
[52] U.S. Cl. ...................................... 29/832; 364/468; 364/469; 364/480; 414/223; 414/224; 414/786; 901/6
[58] Field of Search ....................... 414/786, 223, 224; 29/740, 832; 364/468, 469, 480; 901/6

[56] References Cited

U.S. PATENT DOCUMENTS

| | | | |
|---|---|---|---|
| 4,651,863 | 3/1987 | Reuter et al. | 419/223 X |
| 4,694,570 | 9/1987 | Rudolph et al. | 29/790 |
| 4,706,187 | 11/1987 | Arai et al. | 29/740 X |
| 5,007,162 | 4/1991 | Weeber | 29/740 X |

OTHER PUBLICATIONS

IBM Tech Disclosure Bulletin vol. 30 No. 10 Mar. 1988 pp. 43–45.

Primary Examiner—Carl J. Arbes
Attorney, Agent, or Firm—David S. Romney

[57] ABSTRACT

A technique for efficient use of component placement apparatus used for assembling many different printed circuit boards, wherein all of the printed circuit boards are collectively comprised of more parts than can be handled by a single setup. A portion of the apparatus is dedicated to producing a first family of boards whose identity is determined by their high volume as well as by their parts overlap, while another portion is periodically changed in order to optionally produce different families of boards characterized by their lower volume and lower parts overlap. The changed setups required for the different families of boards are accomplished off-line while the first family of boards is in on-line production.

8 Claims, 7 Drawing Sheets

CURRENT PARTS IN CELL: ___ ___ ___ ___ ___ ___ ___ ___

| BOARD | NEW PARTS | VOLUME | NEW PARTS/VOLUME | |
|-------|-----------|--------|------------------|---|
| MORGAN | F,J,M,N | 1100 | 0.0036 | ← LOWEST RATIO IS BEST |
| OCELOT | G,H,Q,L | 668 | 0.0060 | |
| TARZAN | A,J,K,N | 900 | 0.0044 | |

FIG 8A

CURRENT PARTS IN CELL: F  J  M  N ___ ___ ___ ___

| BOARD | NEW PARTS | VOLUME | NEW PARTS/VOLUME | |
|-------|-----------|--------|------------------|---|
| OCELOT | G,H,Q,L | 668 | 0.0060 | |
| TARZAN | A,K | 900 | 0.0022 | ← NOW THIS IS BEST |

FIG 8B

CURRENT PARTS IN CELL: A  F  J  K  M  N ___ ___

| BOARD | NEW PARTS | VOLUME | NEW PARTS/VOLUME | |
|-------|-----------|--------|------------------|---|
| MORGAN | F,J,M,N | | | ← CELL CONSISTS OF MORGAN AND TARZAN |
| TARZAN | A,K | | | |

FIG 8C

HIGH MIX PRINTED CIRCUIT ASSEMBLY TECHNIQUE

RELATED APPLICATIONS

This application relates to copending application Ser. No. 07/590,611 filed by inventors Corey A. Billington and Margaret L. Brandeau, entitled "System and Method for Optimum Operation Assignments in Printed Circuit Board Manufacturing", which is owned by the assignee of the present application and is incorporated herein by reference.

BACKGROUND OF THE INVENTION

This invention relates generally to work allocation in an assembly line, and more specifically to operation assignment problems in a printed circuit (PC) board assembly process.

The problem faced by engineers designing a new surface mount technology (SMT) production line fairly represents the difficulty encountered by other manufacturers of low-volume, high technology printed circuit assemblies (PCAs). The assemblies have relatively low component part commonality. Demand for the products varies greatly. And the plant must provide support-life boards for discontinued products as well as prototype boards for a multitude of new products.

The "greedy board" approach proved especially useful for the problem at hand because it weighs volume against part commonality when assigning boards to cells. Other group technology technique typically ignore the impact of volume. The algorithm requires a list of boards, board volumes, and a bill of materials for each board.

OBJECTS AND SUMMARY OF THE INVENTION

The new SMT line, once implemented, needed to meet a number of stringent criteria in order to be considered successful. First and foremost, it had to deliver high-quality, low-cost products. It also had to operate consistent with just-in-time philosophy, which meant little work-in-progress inventory (WIP) and short cycle times. Underlying these constraints was the expectation of rapid growth of SMT volumes and types of products, so the new line'design also had to support a sound growth strategy with little change in layout or operating policy.

This chronicles the successful application of the "greedy board" heuristic to the problem of assigning individual printed circuit board assemblies to product cells in a high-mix, capacity-constrained production environment. The specific case presented concerns the design of a high-speed surface mount line, but the approach can be readily generalized to other electronics manufacturing problems.

In this case, temporal cells were designed to run at different times on the same set of equipment (two series Fuji CP-IIIs). The components in the first cell, comprising the highest volume boards, were fixed on the entire first machine and half of the second. The remaining bank of the second machine was used to set up additional cells to run all remaining boards. Thus, high-volume boards could run at any time, while operators set up cells for low-volume work during high-volume board production. This approach improves machine utilization, accommodates changing mix, and permits simple operational alternatives.

As an additional feature, color coding is used to identify all component parts included in a cell, and number identifications are used to facilitate proper sequential placement of the component parts in the feeder slots of the machines.

BRIEF DESCRIPTION OF THE DRAWINGS

FIGS. 8A, 8B and 8C shows in tabular form how cells are formed by selecting a board based on a preference of high volume boards needing the fewest additional parts not already included in the cell, in accordance with the so-called "greedy board" heuristic;

DETAILED DESCRIPTION OF PREFERRED EMBODIMENTS

Figure 1B:
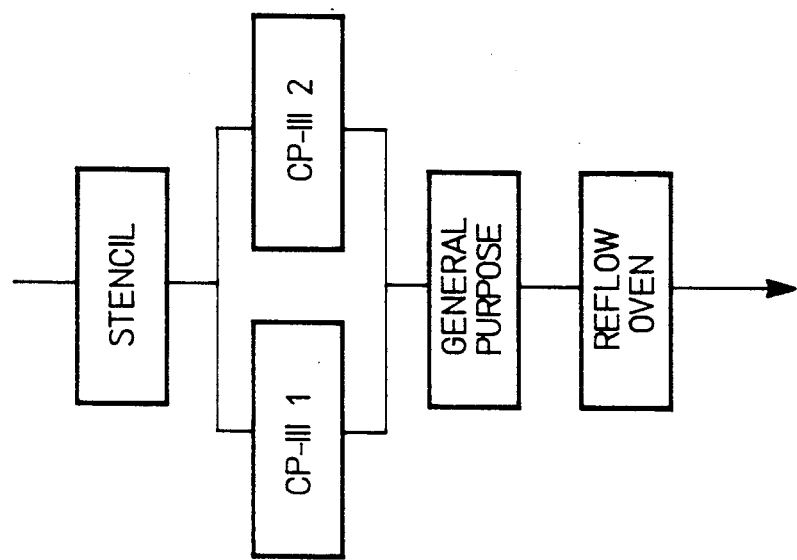
FIGS. 1a and 1b shows two typical surface mount technology (SMT) lines using pick-and-place machines in series or parallel configurations.
Figure 1A:
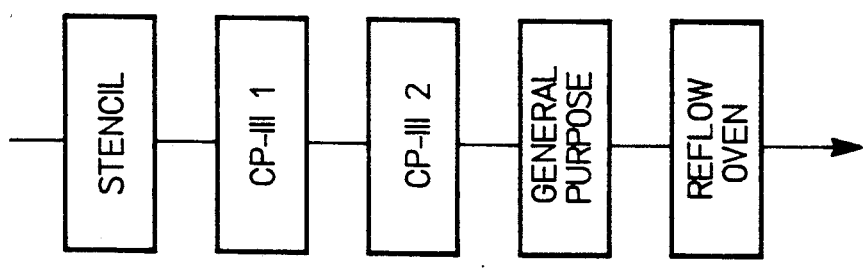

The equipment set for the line included one Fuji GSP-II stencil machine, two Fuji CP-III high-speed pick-and-place machines (to be arranged either in series with the other machines or in parallel), a Fuji IP-II general-purpose pick-and-place machine, and a Vitronics infrared solder reflow oven. A preliminary analysis of demand on each of these machines and their respective capacities revealed that the bottleneck process would be the two CP-IIIs, regardless of the arrangement of the two machines, and subsequent efforts focused on developing a plan for the use of those machines. FIG. 1 shows the two material flows considered.

One aspect of the CP-IIIs that makes them the bottleneck is that it takes a long time to set up new parts on the machine when changing from batch to batch. Each machine holds about 100 parts (part capacity is a function of individual part sizes, which are variable). Yet the site supports hundreds of parts more than the capacity of the machines, making it impossible to put all parts on line, even with the machines in series. Between any two batches, there would be dozens of CP-III parts to set up.

In the absence of a clever setup reduction scheme, the expected average parts setup time from one run to the next would be about 60 minutes. By comparison, actual run times for average boards at the site are about four minutes. Thus, for a typical run of ten boards, the run would consist of 60% setup and 40% running time on a CP-III. With equipment costs as high as they are, this sort of machine utilization was unacceptable.

Cells in PCA

For this SMT line design, the definition of a cell is simply a group of products that can be built with a single part setup on the CP-IIIs. With SMT boards it is important not to have solder-stenciled boards sitting for longer than about thirty minutes before reflow, so ti is essential that boards to completed with only one pass through the machines, an additional constraint faced in this situation. All CP-III parts must be set up for all boards in the cell.

Another consideration complicating the development of a group technology solution was the flow through the two CP-IIIs. With the two machines in series, more parts could be dedicated, allowing more boards in each cell. With the CP-IIIs in parallel, on the other hand, two cells could be set up at a time. Parallel machines were tempting, for it is easier to balance work on them. With series machines, more blocking or starving would be expected, a curse for a bottleneck process.

The parallel arrangement was ultimately rejected for several reasons. First, the stencil printer and the IP-II have significant setup times of their own, and they could not process boards for the two CP-IIIs simultaneously. This would lead to large buffers before and after the CP-III area, violating the goals of low WIP and cycle times. Also, duplicate setups on two machines (or two setups with high part overlap) would require an undesirable, increased part feeder and inventory cost. Finally, the parallel arrangement would result in a more complicated material flow, presenting more opportunities for errors and confusion.

With only one line with machines in series, the decision to use a group technology approach implied that temporal cells would be defined, rather than physically separate manufacturing cells. That is, a particular production cell would be set up by placing the appropriate parts on the machines, then all of the boards using that setup would be built before time would ge taken to set up the next family of boards. No significant setup to the machine would be required between runs of any two boards in the same cell.

With multiple cells running on the same line (albeit at different times), the issue of setups between cells remains important. As setups between individual boards in a single cell are nil, it is therefore desirable to have as great a volume of boards as possible in a given cell. This transcends the notion that the greatest number of separate board numbers is key. The proper way to view the problem, from a qualitative point of view, is to reduce as much as possible the expectation that the next board built is in another cell (with another setup). This requires weighting by volume; the greater the demand for a particular board, the more likely it is to appear in the production schedule, especially when multiple, small batches run daily.

Group Technology

Reducing or eliminating lot-to-lot setups quickly became the key objective of the design process. Since it would be impossible to put all of the parts on line, a process-based solution became imperative. Operating policies based on a group technology approach were the answer.

Group technology traditionally refers to the manufacture of parts or products groups together into "families," or "cells," on the basis of similarities between key attributes. The similarities might be a function of the design, the necessary manufacturing processes, or both. The grouping of similar products permits the same tools and fixtures to be used, vastly reducing the time spent setting up each batch. Products that have distinctly different characteristics run in another cell on a different machine, or at a different time on the same machines, following a single major setup.

New products resembling existing products can be introduced with little trouble or expense, but completely new designs that do not fit in an established group might cost more due to increased setups. Thus, the use of clever grouping in manufacturing can reduce costs. Designers can consider the cost of deviating from current designs as they create new products.

The PCA situation, featuring assembly rather than fabrication, suggests a slightly different approach to the grouping process than the one typically encountered. Most significantly, no complicated, new coding system is required to classify products for sorting into groups as is often used for grouping fabricated parts.[2] Instead, products can be grouped on the basis of common part numbers. At the most rudimentary level, only a list of each board's constituent components is required to divide PCAs into production cells.

Techniques abound for actually dividing a list of products into production cells. Given a production schedule and a set of physical constraints (like the number of parts that can fit on a machine), it is possible to cast the problem of minimizing setups as a simple mixed-integer linear program. Such a formulation to define a single production cell would take this form:

minimize setup time
subject to:
    all components set up for board
    demand met for all boards
    machine part capacity not exceeded However, for situations such as this, where there are dozens of products to consider, each drawing from a pool of several hundred possible component parts, the actual solution time for the problem is prohibitively large. Also, the optimal result produced is only valid for the explicit conditions in the model—and conditions change frequently on the production floor. Heuristic assignment techniques, while suboptimal, provide a quick, flexible, and effective alternative.

The Greedy Board Heuristic

The details of the greedy board heuristic are straightforward. Again, the only data required is the list of part numbers on each board and the expected demand for each board. Specifically, cells are added one at a time by selecting the remaining unassigned boards with the lower ratio of new parts added to the cell to board volume.

For this example consider the following boards with the stated average monthly volumes and constituent components:

| | | |
|---|---|---|
| appaloosa | 1400 | E, H, N, P |
| bobcat | 132 | C, N |
| jaguar | 2668 | B, D, F, H, N |
| morgan | 1100 | F, J, M, N |
| ocelot | 668 | G, H, Q, L |
| puma | 1332 | B, D, H, N |
| tarzan | 900 | A, J, K, N |

Boards are added to the cell by checking the ratio of parts that must be added to the cell to include the board to the volume of the board. To find the first board, pick the lowest ratio:

| | current parts in Cell 1: none | | |
|---|---|---|---|
| Board | New Parts | Volume | Ratio |
| appaloosa | 4 | 1400 | 0.0029 |
| bobcat | 2 | 132 | 0.0152 |
| jaguar | 5 | 2668 | 0.0019* |
| morgan | 4 | 1100 | 0.0036 |
| ocelot | 4 | 668 | 0.0060 |
| puma | 4 | 1332 | 0.0030 |
| tarzan | 4 | 900 | 0.0044 |

Jaguar is lowest, so it is the first board added to the cell. It has the highest product volume added per part slot consumed. Jaguar adds five components (B, D, F, H, and N); assume that there is a limit of eight parts in the cell for this example.

For the next board, the ratios change as follows, since B, D, F, H, and N are now already in the cell:

| | current parts in Cell 1: B, D, F, H, N | | |
|---|---|---|---|
| Board | New Parts | Volume | Ratio |
| appaloosa | 2 | 1400 | 0.0014 |
| bobcat | 1 | 132 | 0.0076 |
| morgan | 2 | 1100 | 0.0018 |
| ocelot | 3 | 668 | 0.0045 |
| puma | 0 | 1332 | 0.0000* |
| tarzan | 3 | 900 | 0.0033 |

Now puma has a lowest ratio, since its part set is a complete subset of the parts already in the cell. Since adding puma to the cell does not require the addition of any parts, the parts-to-volume ratios above still apply. The next lowest is appaloosa, which adds two new parts to the cell (E and P). That brings the total number of parts in the cell to seven, still within the physical constraint.

After adding appaloosa, the part-to-volume ratio for the remaining, unassigned boards become:

| | current parts in Cell 1: B, D, E, F, H, N, P | | |
|---|---|---|---|
| Board | New Parts | Volume | Ratio |
| bobcat | 1 | 132 | 0.0076 |
| morgan | 2 | 1100 | 0.0018 |
| ocelot | 3 | 668 | 0.0045 |
| tarzan | 3 | 900 | 0.0033 |

Now morgan has the lowest ratio. However, to add the morgan board requires two new parts in the cell which will not fit. Bobcat is the only board left that will fit, so it is added, even though it has the lowest theoretical contribution. It is only due to the physical constraint on the size of the cell that makes bobcat attractive. Adding bobcat fills Cell 1, which is made up of parts B, C, D, E, F, H, N, and P.

The second cell is defined by following the same procedure for the remaining boards:

| | current parts in Cell 2: none | | |
|---|---|---|---|
| Board | New Parts | Volume | Ratio |
| morgan | 4 | 1100 | 0.0036* |
| ocelot | 4 | 668 | 0.0060 |
| tarzan | 4 | 900 | 0.0044 |

Morgan is added first. After adding parts F, J, M, and N, the following part-to-volume ratios result:

| | current parts in Cell 2: F, J, M, N | | |
|---|---|---|---|
| Board | New Parts | Volume | Ratio |
| ocelot | 4 | 668 | 0.0060 |
| tarzan | 2 | 900 | 0.0022* |

Tarzan is added, bringing the total part count to six in the cell (A, F, J, K, M, N). Ocelot still has four parts not in the cell, so it will not fit in Cell 2 without violating the total part ceiling. It must go in Cell 3. Note that Cell 2 is left with two unused part slots, and Cell 3 has four unused slots that can be used to accommodate new boards.

The final cell definitions are:

| Cell | Board Volume | Parts |
|---|---|---|
| 1 | 5532 | B, C, D, E, F, H, N, P |
| 2 | 2000 | A, F, J, K, M, N |
| 3 | 668 | G, H, Q, L |

Cell 1 contains 67% of the total board volume; the volume falls off precipitously with the succeeding cells. Some parts appear in more than one cell.

Assigning Boards to Cell

The greedy board heuristic performs well when high setup costs dominate placement costs. The goal is a list of component part numbers to dedicate on the machines. A cell is defined by adding boards one at a time until the physical machine constraint is reached. Thus, the heuristic greedily adds boards to the cell until no more fit. Component part volume is of no consequence. Rather, the volume of boards produced by the cell drives the solution.

The SMT PCA situation called for the use of the greedy board heuristic because of the time required for setups on the CP-IIIs. The heuristic was used to define one cell at a time, ultimately producing a complete list of cells to run at different times on the same machines. The first pass of the heuristic defined the first cell, filled primarily with the highest volume boards (and other boards with high part overlap). The second and subsequent passes were made after removing the first cell's boards, essentially starting fresh each time but pulling from an increasingly smaller set of boards.

Many approaches were proposed in the course of applying the greedy board heuristic to the SMT line. The simplest application called for single cells, holding about 200 different parts each, which could be set up as needed. This would result in the largest possible cells, thus reducing the total number of cells required to include all of the shop's boards. However, there would be a major setup every time a switch was made from one cell to the next.

A feature of the Fuji CP-IIIs is that each machine is actually split into two banks, each holding 50 parts. It is possible with this split-bank feature to run the machine with only one of the banks on line; the other bank can be off line. This permits an operator to work on setting up half the machine while the other bank is busy placing parts on boards. The feature allowed a more refined solution to the problem. The first cell, Cell 1, was defined so that it would use three of the four available part banks, and it would hold about 150 different parts. Since the first cell defined using the greedy board heuristic contains the highest volume boards, it would be used frequently int he course of a normal production day. To make quick response to demand for one of the high volume boards possible, this cell was kept on line at all times. That is, the parts in Cell 1 were dedicated.

Subsequent cells, holding the lower volume boards and/or boards with relatively little part overlap, have additional parts set up on the remaining bank. The 150 parts dedicated to the three CP-III part banks of Cell 1 would also be available for the boards in the other cells when the fourth bank was put in place, so Cells 2 to n could utilize parts from the Cell 1 setup plus additional parts from the flexible fourth bank. In practice, the heuristic was used to define Cells 2 to N by first stripping from the material list the parts dedicated in Cell 1, since those parts were already guaranteed to be on line.

Figure 2:
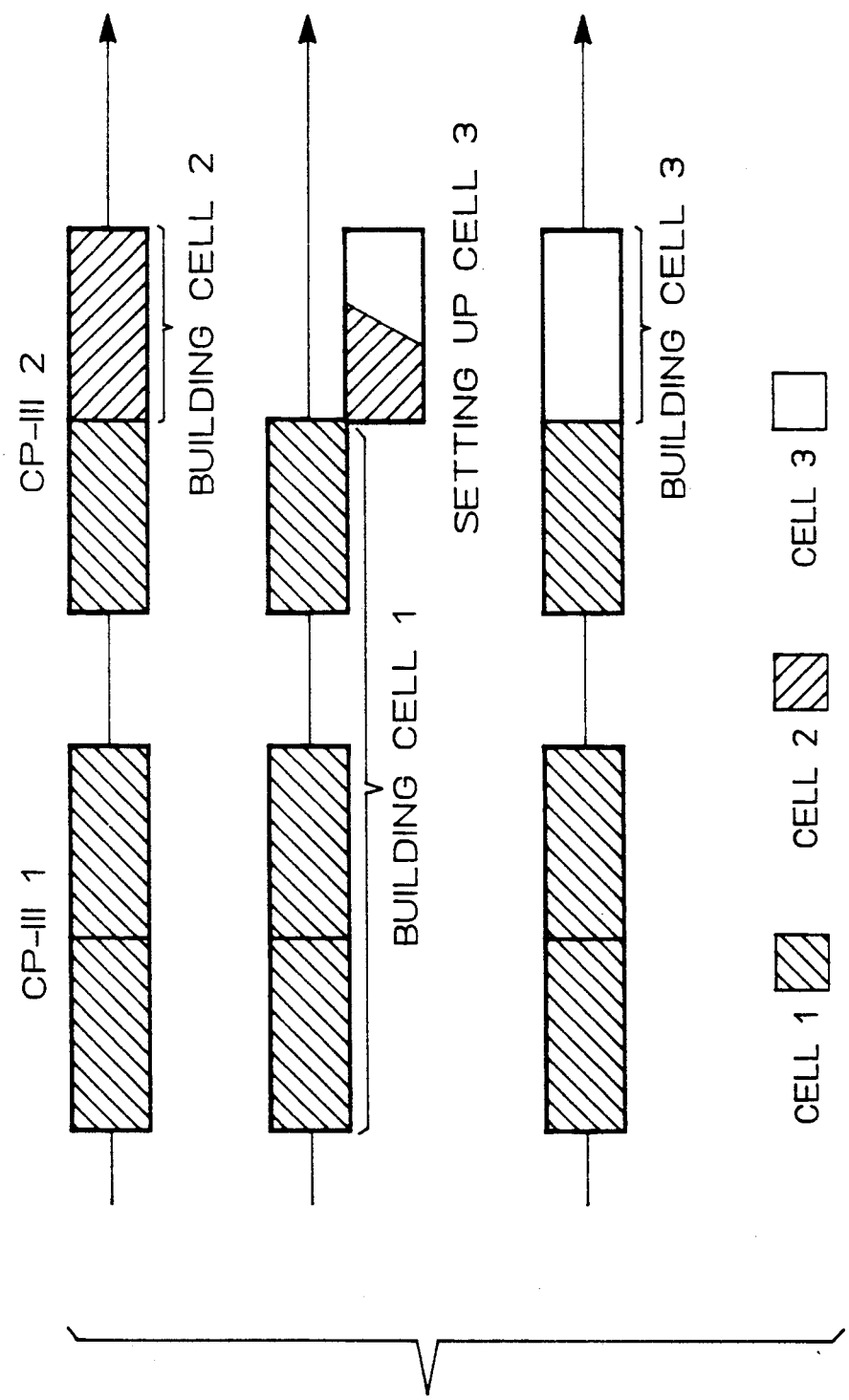
FIG. 2 shows a presently preferred embodiment of the invention incorporated in the series configuration of FIG. 1 wherein the work flow on an assembly line is shifted between different individual product families (cells), allowing the steps for cell 2 or cell 3 to be accomplished off-line while the products of cell 1 are being built on-line.

FIG. 2 shows how a day's work might flow through the line. Cell 1 boards will be built while Cell 2 is being set up. Then, once the setup for Cell 2 is complete, current demand for boards in that cell will be produced. Once that demand is satisfied, more Cell 1 boards will run and the next cell will be set up, as demand warrants. Each day a schedule is released of boards necessary to replenish the demand-pull queues. The operator responsible for initiating flow through the line releases boards in groups so that they run together when their respective cells are set up.

Should a situation arise where a significant change to the daily schedule must be accommodated, a board in any cell can be started through the line with a maximum delay of only about an hour. That is the time required to completely tear down one setup on the fourth bank and install another. Cell 1 boards could be built during the setup time, too. If the change requires building a board in Cell 1, which would be the most likely event, then the board could be run immediately, since that cell is always set up.

This approach eliminates the problem of machine idle time during cell setup. Because Cell 1 has such a large expected volume, boards from that cell can be run through the line while the fourth bank is changed over from one of the smaller cells to the next. There will almost always be sufficient demand for Cell 1 boards to fill the time required to execute the setup for the next cell; most of the time, the setup will be completed before the Cell 1 boards are completed. This arrangement results in essentially zero expected idle time due to setup for the machine—a far cry from the base case of 60% setup idle time.

Using this approach resulted in the definition of five separate cells for the new line. Results shown in Table 1 reveal that Cell 1, the cell with the 150 dedicated parts, accounts for the vast majority of the expected work. Roughly speaking, Cell 1 should be running about three quarters of the time, even though it accounts for only about a third of the factory's unique assemblies.

TABLE 1

| Cell # | Division of Work Between Cells | | |
|---|---|---|---|
| | unique assemblies | assembly volume | placements |
| 1 | 35% | 75% | 75% |
| 2 | 35 | 15 | 15 |
| 3 | 15 | 6 | 7 |
| 4 | 10 | 4 | 3 |
| 5 | 5 | <1 | <1 |

Implementation

The key to success of the group technology approach hinges on the actual implementation on the shop floor. The analysis described so far, while based on realistic data, ignores some practical issues that must be addressed in order to generate a truly workable solution.

Foremost among the problems encountered in taking the group technology cells from the drawing board to the shop floor was the challenge of balancing work between the two series CP-IIIs. In practice there will almost always be an imbalance that results in starving the downstream machine of work (when the upstream machine takes longer to process the board) or blocking the upstream machine (when the downstream machine takes longer). Problems with blocking and starving can be mitigated by the use of buffers of work in progress, but the objective was to reduce WIP as much as possible.

Two further enhancements allowed for better work balance between the CP-IIIs in series. First, work was balanced between the CP-IIIs using another heuristic approach. This heuristic balanced work board by board considering the quantity required of each part number, the time for the machine to place that part type, and specific machine constraints (for example, "tall" parts must be placed on a board last and therefore must always be set up on the second CP-III). The balance was further improved by making a few of the most common parts available on both machines. These components, mostly common resistors and capacitors, occurred in high volume on many boards. In sacrificing a few part slots and putting just a few parts (roughly a half dozen) on each machine, the expected work balance was greatly improved.

Second, because the general purpose pick-and-place machine (the IP-II) has unused capacity, parts unique to a single board were moved to the IP-II. Those parts would have a limited contribution to any production cell, since they would only be used for one board. Parts originally classified as CP-III parts were reassigned to the IP-II on a board-to-board basis, and the material list used to define the CP-III cells was modified accordingly. Calculations showed that the additional time required to set up the IP-II would not jeopardize the flow; the CP-IIIs would still be the bottleneck and the IP-II would still have some idle time.

One of the many concerns that was raised about the implementation of the group technology solution addressed the ability of the operators to accurately set up the cells each time. In fact, the likelihood of inaccurate setups should be greatly reduced because there are fewer unique setups. With no cells, each assembly has its own setup. The operator is required to carefully sequence part feeders by matching a nondescriptive, multicharacter part number. The difficulty of ensuring the proper order, in fact, accounts for much of the time required for a normal setup operation.

With the introduction of cell-based production, the setup process was greatly simplified. First of all, with cells there are only a few different setups to manage, and the largest, Cell 1, is fixed in place. Cells 2-5 are defined for the operator using a simple scheme using colored tape and numbers. The part feeders for each cell set up off line are marked with a different color. Then, the feeders are numbered in the order of their appearance on the CP-III feeder bank. Thus, when Cell 3 is set up, all of the feeders with blue labels should be lined up in numerical order; no other feeders should have blue labels. With this practice in place, the difficult setup requiring matching of the part codes is eliminated. Simple visual cues indicate quickly that the machine is ready to run. The simplicity of this approach leads to higher quality products, as there are fewer defects attributable to setup errors.

Figure 3:
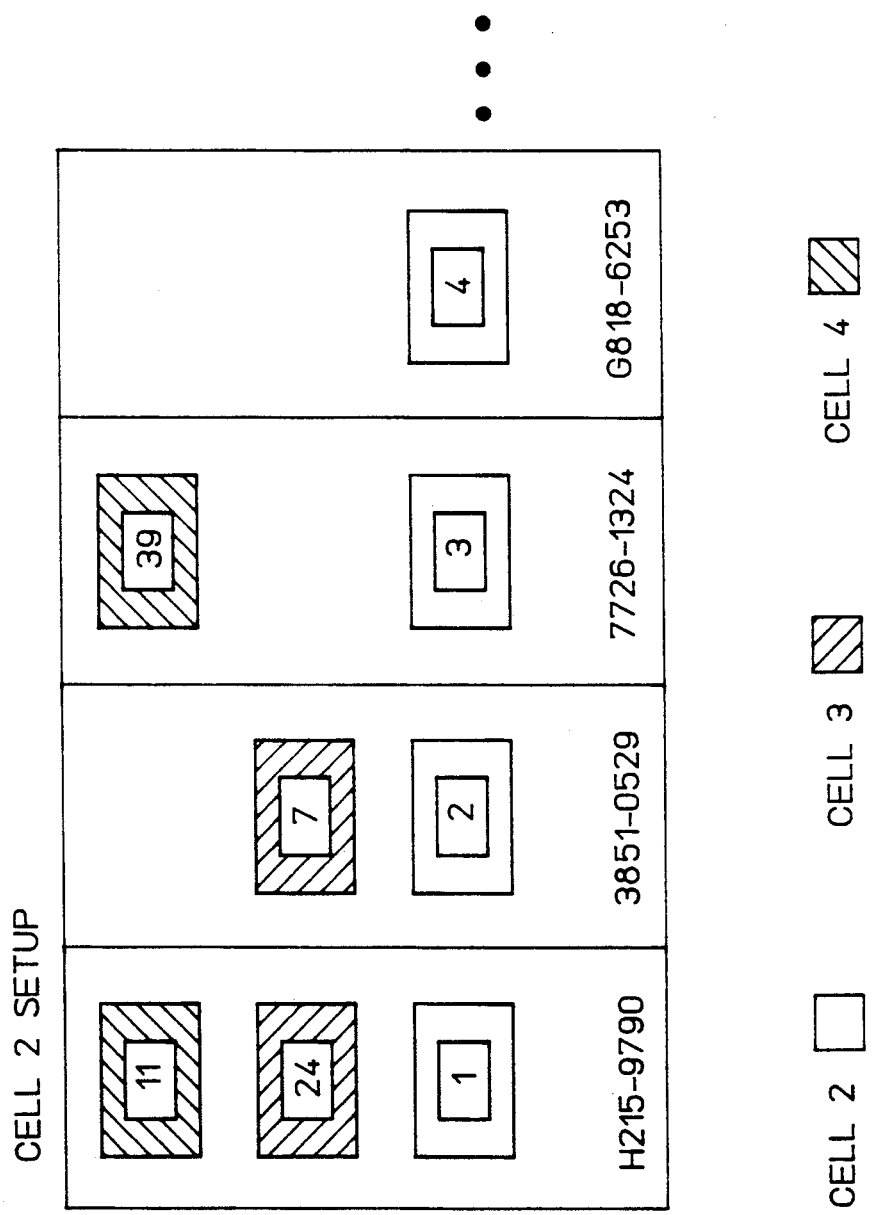
FIG. 3 shows a preferred method of labeling part feeders for easy accurate setup of parts used in building all of the boards included in one product family or cell.
Figure 4:
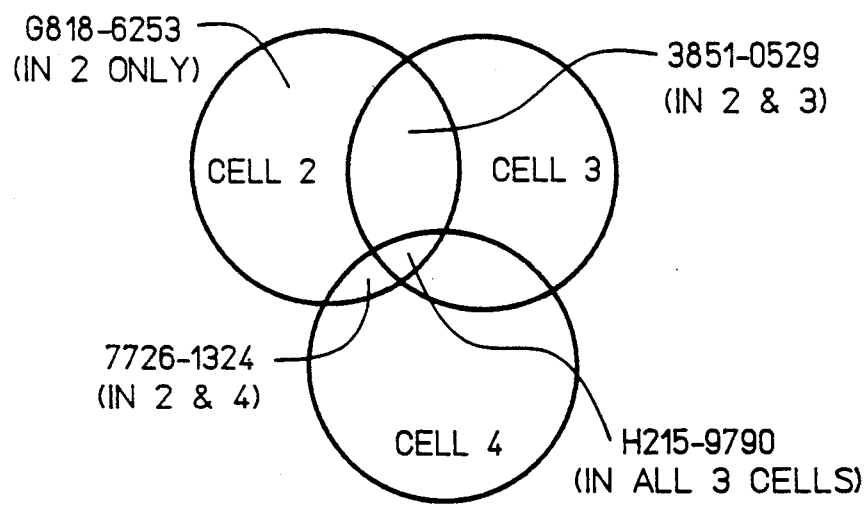
FIG. 4 and FIGS. 5A and 5B schematically show an exemplary overlap of parts occurring between products making up different product families or cells.
Figure 5A:
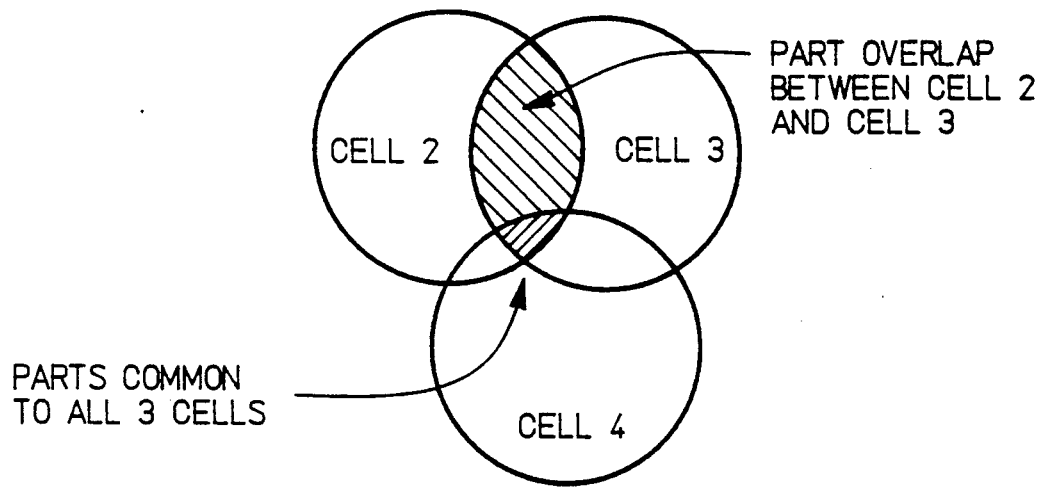
Figure 5B:
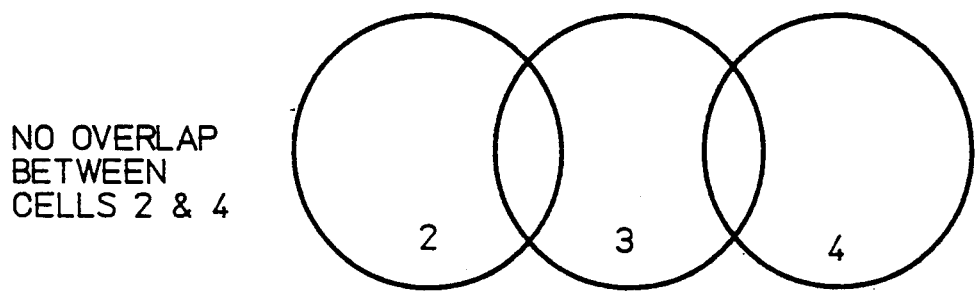
Figure 6:
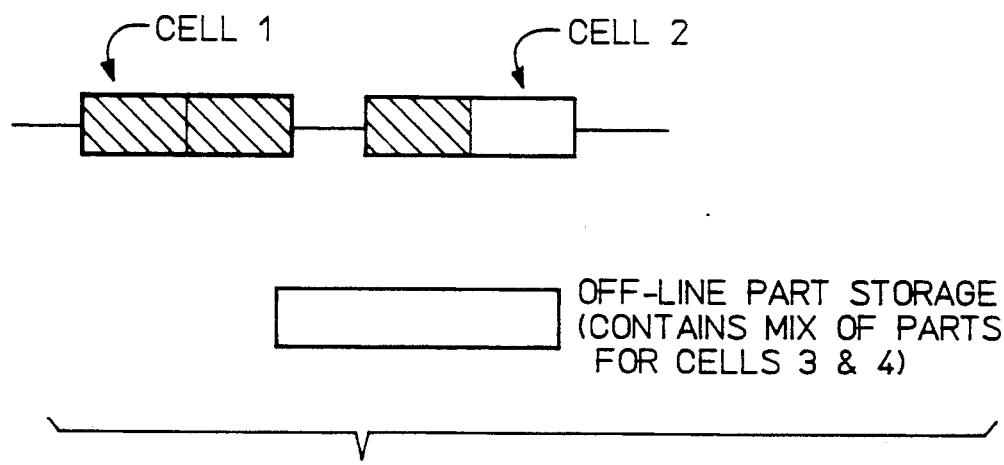
FIG. 6 schematically shows the off-line storage of parts for cells not currently set up on the assembly line.
Figure 7:
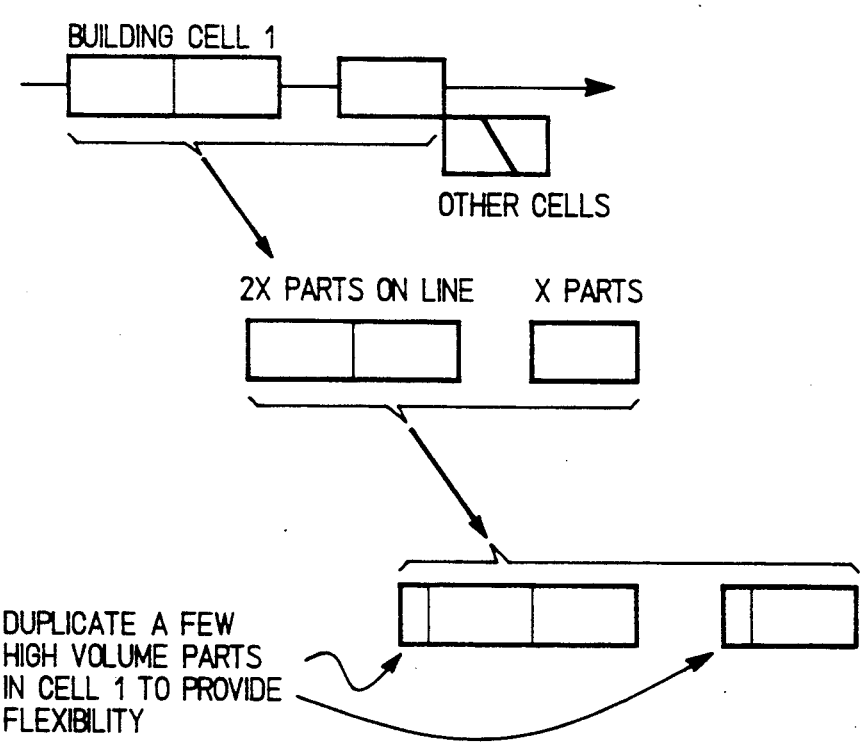
FIG. 7 schematically shows how parts can be duplicated in the feeders of sequential machines in order to flexibly achieve balance between such sequential machines.
Figure 9:
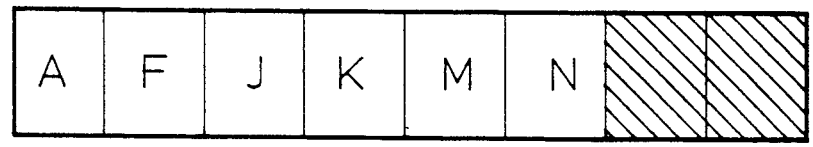
FIG. 9 illustrates how certain feeder slots can be left vacant in order to allow future boards with additional parts to be added to an existing cell.
Figure 10:
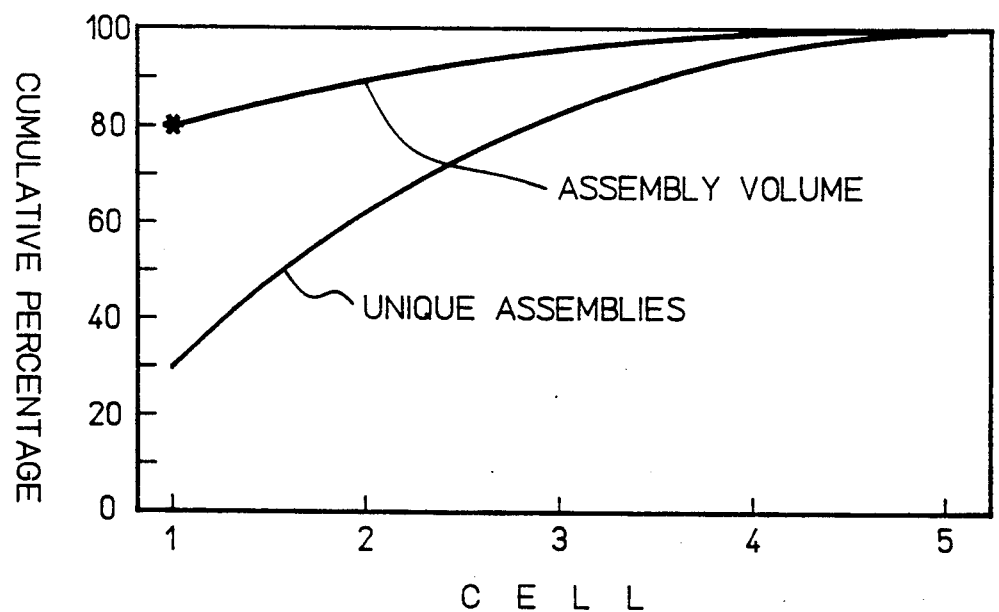
FIG. 10 graphically shows the assembly board volume and the assembly board uniqueness for exemplary cells 1-5 formed in accordance with the teachings of the invention.

FIG. 3 shows how the different component parts constituting each cell are coded for easy identification by the operators. FIGS. 4-5 show now multiple parts can be included in more than one cell, and FIG. 6 shows the off-line part storage for parts of cells which are not currently in production.

As new boards are added and old boards drop off in volume, the performance of the system degrades. The load balancing between the two machines deteriorates. Also, some of the ostensibly low-volume cells (Cells 2-5) might be run more and more often as demand increases for boards in those cells. Redefining the cells is thus a natural part of running the SMT line. Each redefinition requires the generation of new pattern files, and the labels on the part feeders have to be redone. With an automated system, cells are examined and rebalanced every few weeks. This keeps changes to a minimum, favoring frequent, minor changes over infrequent but substantial changes. Newly introduced products are also handled in this way, and the changes keep cell alignment and part balance close to optimal. Feeder relabelling to redefine cells is timed to coincide with preventive maintenance of the machines.

Qualitative Advantages

The principal advantage of the group technology approach with the use of the Fuji split bank feature is bringing batch setup times close to zero. Along with this obvious, quantifiable improvement in operating efficiency (machines running close to 100% of the time), there are many qualitative advantages to the solution.

First, with no machine setup required between board types within a cell, batch size is not an issue. Low-volume boards can run in very small batches, as small as the other process steps can accommodate. This allows a demand-pull strategy and avoids building to stock. The line can build in any quantities needed.

The group technology solution also has a positive effect on quality. Since the parts for 75% of the board volume (Cell 1) are dedicated to machine slots, those boards do not suffer defects due to errors in part set up. For the remaining 25% of the board volume falling into other cells, the part set up is so simplified due to colored tape labelling that set up errors are virtually eliminated. Since many small SMT parts are unmarked by the vendor, defects due to part set up errors cannot be detected visually and are not found until the test step at the end of the process. By the time an error is discovered, a number of boards may have been produced, generating a great deal of repair work. Thus, eliminating or reducing set up errors has a significant impact on both quality and the anticipated cost of repair.

Another advantage of this approach is a reduction in the number of production personnel required to run the line. Since part setups occur on only one CP-III, a single operator can run both CP-III's.

Finally, this solution allows for growth as volumes and number of board types increase. As the capacity of the first line is reached, a second line with the same configuration will be installed. This second line will be given a different set of cells, with many boards fitting cells on both lines to allow for load balancing.

Conclusion

The group technology approach incorporating the use of the split bank feature to take cell set up off-line met all of the goals for a process design. The goal of flexibility to build any board in any quantity as requested by the demand-pull system was met by the virtual elimination of batch setup time. Overall system cost was reduced by increasing line efficiency (run time approaching 100%). Savings are also attributed to reduce finished goods inventories, reduced defects, and reduced production personnel. Finally, the series configuration provides a smooth, linear flow, minimizing queuing on the line. This flow keeps levels of WIP and cycle time as low as possible.

While the examples cited here demonstrate the success of group technology at SMT line design, the ideas can be easily applied to other printed circuit assembly production areas. Similar advantages can be expected in through-hole assembly shops and shops with mixed technologies.

While preferred exemplary embodiments of the invention have bee described, it is to be understood that various changes and modifications can be made without departing from the spirit and scope of the invention as defined by the following claims.

We claim:

1. A method of assembling components on multiple circuit board assemblies which collectively have a greater number of different components than can be accommodated at the same time by production apparatus, including the steps of:

choosing a first family of circuit board assemblies based on the volume for such assemblies and the amount of component overlap between such assemblies;

setting up the production apparatus by loading the components of such first family resulting from said choosing step into a portion of the production apparatus;

running the production apparatus in a first mode to place the components of such first family into installation position;

selecting a second family of circuit board assemblies;

additionally setting up the production apparatus by loading components of such second family into another portion of the production apparatus; and running the production apparatus in a second mode to place the components of such second family into installation position.

2. The method of claim 1 wherein said choosing step is based on the ratio of parts-to-volume for a particular circuit board assembly.

3. The method of claim 1 wherein said selecting step is based on the ratio of parts-to-volume for a particular circuit board assembly.

4. The method of claim 1 wherein said running steps include running two separate production apparatus apparatus in series.

5. The method of claim 4 wherein each of said two separate production apparatus used in said running steps includes some of the same components.

6. The method of claim 1 which further includes visually coding those components resulting from said choosing step.

7. The method of claim 1 which further includes visually coding those components resulting from said selecting step.

8. The method of claim 1 which further includes selecting and additionally setting up during said running in the first mode.

* * * * *